United States Patent [19]

Liebert et al.

[11] Patent Number: 4,512,812

[45] Date of Patent: Apr. 23, 1985

[54] METHOD FOR REDUCING PHOSPHOROUS CONTAMINATION IN A VACUUM PROCESSING CHAMBER

[75] Inventors: Reuel B. Liebert, Peabody; Carl J. Russo, Ipswich, both of Mass.

[73] Assignee: Varian Associates, Inc., Palo Alto, Calif.

[21] Appl. No.: 534,950

[22] Filed: Sep. 22, 1983

[51] Int. Cl.³ .......................... B08B 7/04; B08B 9/00
[52] U.S. Cl. .................................. 134/21; 134/22.18; 134/30; 134/31; 134/42
[58] Field of Search ................... 134/21, 22.18, 30, 31, 134/42

[56] References Cited

U.S. PATENT DOCUMENTS 3,615,956 10/1971 Irving et al. .................... 156/646 X
4,138,306 2/1979 Niwa ............................... 156/646 X

FOREIGN PATENT DOCUMENTS 2062689 5/1981 United Kingdom ............ 134/22.18

Primary Examiner—Marc L. Caroff
Attorney, Agent, or Firm—Stanley Z. Cole; William R. McClellan

[57] ABSTRACT

A method for reducing contamination in a vacuum processing chamber includes introducing into the vacuum chamber a gas selected to react with the contaminant and form a compound more volatile than the contaminant. The volatile compound is then removed from the vacuum chamber, typically by vacuum pumping. In one embodiment, the vacuum chamber is an ion implantation chamber, the contaminant is phosphorous and the gas is water vapor, which reacts with the phosphorous to form phosphine gas or other high vapor pressure phosphorous-containing substances.

5 Claims, 2 Drawing Figures

METHOD FOR REDUCING PHOSPHOROUS CONTAMINATION IN A VACUUM PROCESSING CHAMBER

BACKGROUND OF THE INVENTION

This invention relates to vacuum processing of semiconductor wafers and, more particularly, to novel methods and apparatus for removing contaminants from an ion implantation system.

Ion implantation has become a standard technique for introducing impurities into semiconductor wafers. A beam of ions is generated in a source and directed with varying degrees of acceleration toward a target wafer. Impurities are deposited into the bulk of the semiconductor wafers by using the momentum of energetic ions as a means of embedding them in the crystalline lattice of the semiconductor material. Typically, the ion beam has dimensions smaller than the semiconductor wafer, thereby requiring movement of the ion beam relative to the semiconductor wafer to obtain uniform coverage of the wafer surface. The relative movement can be effected by mechanical movement of the wafer, by deflection of the ion beam or both. Furthermore, the wafers can be presented to the ion beam either one at a time (serial processing) or in a batch mode. In one batch system, up to 25 wafers are mounted on a disk which is rotated relative to an ion beam.

At least some overscan is required in serial process systems to insure dose uniformity. In batch systems, the ion beam is scanned over an annular portion of the rotating disk which includes the target wafers. Thus, impurity ions are deposited or implanted not only on the wafer but also on the wafer holding mechanism and on the walls of the ion implantation chamber adjacent to the wafers. With time, these impurity deposits can accumulate substantially. In subsequent ion implantations, the deposits are sputtered by the ion beam and evaporated due to the elevated temperatures caused by the ion beam. A portion of the sputtered and evaporated deposits find their way to the surface of the semiconductor wafer and appear as contaminants thereon.

In the fabrication of LSI and VLSI circuits, the individual devices making up the circuits are exceedingly small and require carefully controlled processing. The dosage of implanted impurities must be tightly controlled to insure proper operating parameters. Furthermore, even a small amount of contamination on such small devices can cause degradation or destruction of the circuit. Thus, the above-described problem of deposits on the walls and other components of an ion implantation chamber has been substantial. The problem is compounded by the fact that various species of ions are run in an implantation system at different times. Thus, the deposits can contain several different species and, in general, are not the same as the species being implanted.

A number of techniques have been developed to alleviate the problem of contamination in an ion implantation system. Some users limit an ion implantation system to running only one ion species. However, this technique requires several expensive ion implantation systems to run several species and limits production flexibility. Removable vacuum chamber liners have also been utilized. However, the liners are expensive, and replacement is a time-consuming process. Still other techniques have involved physical cleaning of the chamber to remove deposits. Mechanical scrubbing and solvent cleaning have been used. Either method is time-consuming and presents safety problems, since the deposits are likely to be toxic. Ion beam sputtering has been used to remove the deposits. This technique has not been effective, since the deposits are spread around the vacuum chamber rather than removed.

It is a general object of the present invention to provide novel methods and apparatus for reducing contamination in a vacuum processing chamber.

It is another object of the present invention to provide methods and apparatus for removing contaminants from a vacuum processing chamber which do not require parts removal or disassembly of the processing chamber.

It is yet another object of the present invention to provide methods and apparatus for removing contaminants from a vacuum processing chamber in a short time.

It is still another object of the present invention to provide methods and apparatus for removing contaminants from a vacuum processing chamber in which the safety of operating personnel is not endangered.

SUMMARY OF THE INVENTION

According to the present invention, these and other objects and advantages are achieved in a method for removing a contaminant from a vacuum processing chamber. The method comprises the steps of introducing into the vacuum chamber a gas selected to react with the contaminant and form a compound more volatile than the contaminant and removing the volatile compound from the vacuum chamber. In one embodiment, the vacuum chamber is an ion implantation chamber, the contaminant is phosphorous and the gas is water vapor, which reacts with the phosphorous to form phosphine gas or other high vapor pressure phosphorous-containing substances. The removal technique is evacuation with a vacuum pump.

According to another aspect of the present invention, there is provided apparatus for removing a contaminant from a vacuum processing chamber. The apparatus includes means for introduction into the vacuum chamber of a gas selected to react with the contaminant and form a more volatile compound and means for removing the volatile compound from the vacuum chamber.

According to yet another aspect of the present invention, there is provided a method for reducing contamination of a workpiece in a vacuum processing chamber comprising the step of introducing into the chamber a gas selected to react with the contaminant and form a highly stable compound of low volatility.

BRIEF DESCRIPTION OF THE DRAWINGS

For a better understanding of the present invention, together with other and further objects, advantages and capabilities thereof, reference may be had to the accompanying drawings which are incorporated herein by reference and in which.

DETAILED DESCRIPTION OF THE INVENTION

Figure 1:
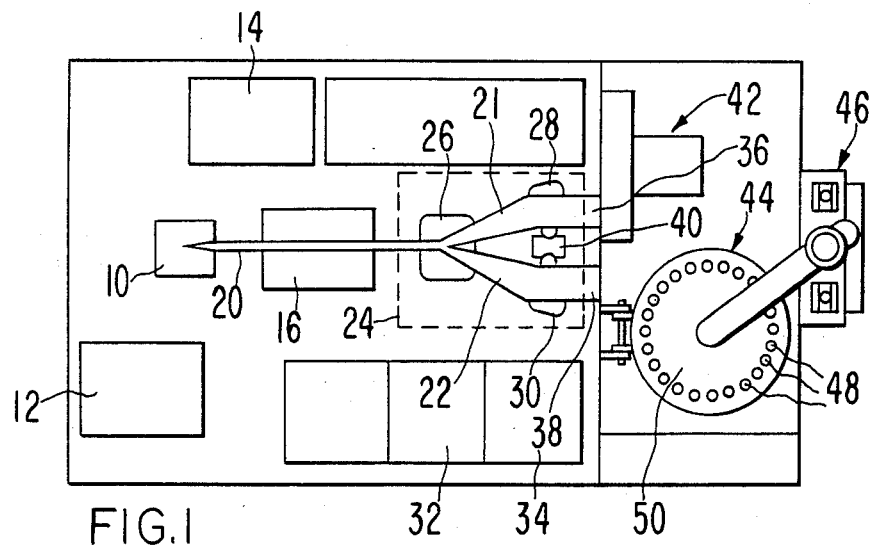
FIG. 1 is a schematic diagram of a batch ion implantation system in which the method and apparatus of the present invention can be employed.

An ion implantation system in which the method and apparatus of the present invention may be employed is illustrated in schematic form in FIG. 1. The system includes an ion source 10, an ion source power and gas supply 12 which supplies a gas of the desired dopant species to the ion source 10, a high voltage power supply 14 and a momentum analyzer 16. An ion beam 20 is generated in the source 10 and is accelerated to the desired potential. The ion beam 20 passes through a magnet assembly 24 which includes a scan magnet 26 for scanning the beam 20 through a prescribed angular deflection and an angle corrector magnet 28, 30 for deflecting the scanned beam 20 to a direction parallel to the initial beam direction. The effect of the magnet assembly 24 is to produce a translation or scanning of the ion beam 20 without angular change. The magnet assembly 24 is energized by power supplies 32, 34 to form a scanned ion beam 36 or a scanned ion beam 38. A neutral trap 40 collects the neutral portion of the ion beam 20. A dual end station includes rotating disk assemblies 42, 44 and a control panel 46. Semiconductor wafers 48 are mounted, either manually or by an automatic wafer loading system, on a rotating disk 50. In FIG. 1, the disk assembly 42 is shown in the closed, or implantation, position while the disk assembly 44 is shown in the open, or wafer exchange, position. Annular regions of the disk assemblies 42, 44 where the wafers are mounted are scanned by the ion beams 36, 38, respectively. However, only one of the disk assemblies 42, 44 is scanned at a time. Typically, one of the rotating disk assemblies 42, 44 is scanned by the ion beam while the wafers are changed on the other disk assembly. The entire beamline between the ion source 10 and the wafers 48 is maintained at high vacuum. An example of the system shown in FIG. 1 and described hereinabove is the Model 80-10 Ion Implantation System manufactured and sold by Varian/Extrion Division, Gloucester, Mass.

Figure 2:
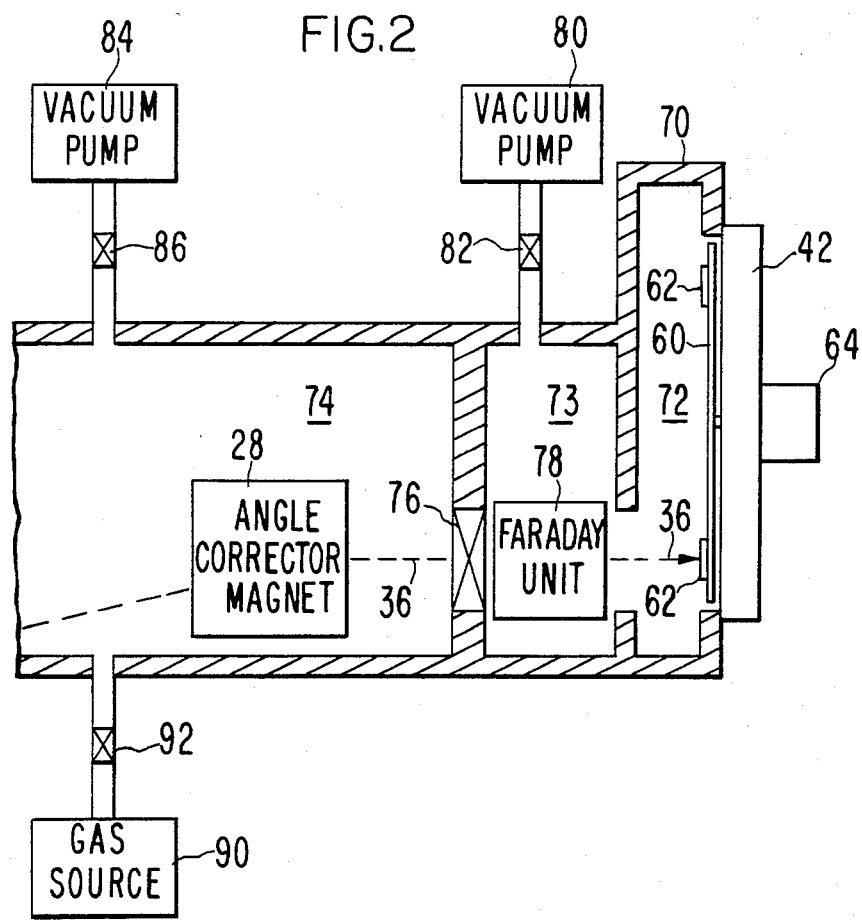
FIG. 2 is a simplified cross-sectional view of a portion of the ion implantation system of FIG. 1 illustrating the method and apparatus of the present invention.

Referring now to FIG. 2, there is shown a simplified diagram of one of the end stations and the adjacent portion of the beamline of the system of FIG. 1. The rotating disk assembly 42 includes a rotating disk 60 having wafers 62 mounted thereon. The rotating disk 60 is driven by a motor 64. A housing 70 defines an implant chamber 72 and a Faraday chamber 73 which can be isolated from the beamline 74 by a gate valve 76. A Faraday unit 78 is positioned in the path of the ion beam 36 and measures the ion dosage delivered to the target. A vacuum pump 80 is coupled through an isolation valve 82 to the Faraday chamber 73. A vacuum pump 84 is coupled through an isolation valve 86 to the beamline 74. The gate valve 76 provides the capability to isolate the end station from the beamline 74 when the disk assembly 42 is opened to exchange wafers. After exchange of wafers, the disk assembly 42 is sealed to the implant chamber 72; and the implant chamber 72 and the Faraday chamber 73 are vacuum pumped by the pump 80 after a mechanical pump roughing cycle. The gate valve 76 is then opened, and the ion beam 36 implants the wafers 62 mounted on the rotating disk 60.

The ion beam 36, during scanning of the wafers 62, impinges on an annular region of the rotating disk 60 and portions of the Faraday unit 78. Deposits on these surfaces may then be sputtered and redeposited on the walls of the housing 70 and various other elements of the system. As a result, deposits of the ion beam material accumulate on these elements. In subsequent ion implantation, the deposits are sputtered by the ion beam and evaporated due to the elevated temperatures generated by the ion beam. Some fraction of the sputtered and evaporated deposits find their way to the surface of the wafers. When the deposits are a different species from the ions being implanted, contamination of the wafers results. Even if the deposits are the same species, they will affect total dose and junction depth adversely. The Faraday unit 78 is a particular source of contamination since it is thermally isolated from the main structure of the system and reached relatively high temperatures. Thus, deposits are more readily evaporated from its surfaces.

According to the present invention, a gas source 90 or other material which can volatilize to form a gas is coupled through an isolation valve 92 to the beamline 74. In order to remove the deposits, a gas, which is selected to react with the deposits and form a volatile compound, is introduced into the beamline 74 from the gas source 90. After a time which is sufficient for the gas to diffuse throughout the beamline 74, the Faraday chamber 73 and the implant chamber 72 and to react with the deposits, the volatile reaction compounds are removed by the vacuum pumps 80, 84. Alternatively, the volatile reaction compounds can be removed by flushing with an inert ambient. The reactive gas or the inert gas used for flushing can be heated to speed up removal of the volatile compounds. The compound or compounds formed by reaction of the gas with the deposits should be more volatile than the deposits and, preferably, substantially more volatile than the deposits. The process of introducing the gas into the beamline 74, allowing the gas to react with the deposits, and then vacuum pumping or flushing the beamline 74, the Faraday chamber 73 and the implant chamber 72, can be repeated several times to insure that the deposits are removed. In an alternative embodiment, the gas is selected to react with the deposits and form substances with very high melting points, that is, highly stable substances of low volatility. The deposits are, in effect, stabilized in order to prevent contamination.

In one example of the process in accordance with the present invention, the impurity deposits are phosphorous which has been deposited during ion implantation of wafers with phosphorous ions. When the system is changed to implant wafers with another ion species, for example arsenic, the phosphorous deposits are likely to contaminate the wafers 62 being implanted with arsenic. It has been found that when the cleanup process in accordance with the present invention is performed prior to implantation of the wafers 62 with arsenic, the contamination problem is significantly reduced. In the case of phosphorous deposits, water vapor is introduced into the beamline 74 from the source 90. The beamline 74, the Faraday chamber 73 and the implant chamber 72 are maintained at a pressure in the range between 50 and 500 Torr and preferably in the range between 150 and 200 Torr. Deionized water is introduced through the valve 92, which can be a needle valve. The water vapor is allowed to remain in the beamline 74, the Faraday chamber 73 and the implant chamber 72 for approximately 10 minutes at a pressure in the range between 150 to 200 Torr. The water vapor reacts with the phosphorous to form phosphine gas according to the following equation:

$$\tfrac{1}{4}P_4 + 3H_2O + 3e^- = PH_3 + 3OH^-$$

Other high vapor pressure phophorous-containing substances can also be formed and other reaction equations are possible. The vacuum pumps 80, 84 are then allowed to evacuate the beamline 74, the Faraday chamber 73 and the implant chamber 72 to a pressure below 100 Torr in order to remove the phosphine gas. The above process can be repeated several times to insure that the phosphorous deposits are removed. As a final optional step of the process, dummy wafers can be placed on the rotating disk 60; and an ion beam 36 of argon can be applied to the disk 60 to clean and outgas the surface.

It will be understood that the parameters of the process for removing impurity deposits from the vacuum chamber depend on a number of factors, such as the size of the vacuum chamber, the severity of the deposits and the degree of cleanliness required. The pressure of the cleanup gas must be kept low enough to avoid condensation but must be sufficiently high that the desired reaction occurs at a reasonable rate. If necessary, elevated temperatures can be used to enhance the reaction rate. If the cleanup gas condenses in the vacuum chamber, its removal becomes more difficult. The time depends on the rate of the reaction and the quantity of the deposits. Various gases can be utilized to react with various types of deposits. The criteria is that the gas react with the deposit to form a compound which is more volatile than the deposit and, therefore, can be removed by the vacuum system. Preferably, the reaction compounds should be be significantly more volatile than the deposits. As noted above, the gas can be selected, in an alternative embodiment, to react with the deposits and form substances with very high melting points.

While there has been shown and described what is at present considered the preferred embodiments of the invention, it will be obvious to those skilled in the art that various changes and modifications may be made therein without departing from the scope of the invention as defined by the appended claims.

We claim:

1. A method for removing phosphorous contaminants from a vacuum processing chamber comprising the steps of:
   introducing water vapor into said vacuum chamber to react with said phosphorous contaminants and form a compound more volatile than said phosphorous contaminants; and
   removing said volatile compound from said vacuum chamber.

2. The method as defined in claim 1 wherein said step of removing said volatile compound includes vacuum pumping said chamber.

3. The method as defined in claim 1 wherein said water vapor is introduced into said vacuum chamber at a pressure between 150 and 200 Torr.

4. The method as defined in claim 1 wherein said water vapor is introduced into said vacuum chamber at a pressure between 50 and 500 Torr.

5. The method as defined in claim 1 wherein said vacuum chamber is an ion implantation chamber for ion implantation of impurity dopants into semiconductor wafers.

* * * * *